United States Patent
Jankowski (10) Patent No.: US 11,656,248 B2
(45) Date of Patent: May 23, 2023

(54) CURRENT METER FOR DETECTING CURRENTS IN ELECTRICAL LINES

(71) Applicant: Phoenix Contact GmbH & Co. KG, Blomberg (DE)

(72) Inventor: Martin Jankowski, Seelze (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 39 days.

(21) Appl. No.: 17/266,654

(22) PCT Filed: Aug. 7, 2019

(86) PCT No.: PCT/EP2019/071241
§ 371 (c)(1),
(2) Date: Feb. 8, 2021

(87) PCT Pub. No.: WO2020/035371
PCT Pub. Date: Feb. 20, 2020

(65) Prior Publication Data
US 2021/0318360 A1    Oct. 14, 2021

(30) Foreign Application Priority Data
Aug. 16, 2018   (DE) .................... 10 2018 120 008.0

(51) Int. Cl.
*G01R 15/20* (2006.01)
*G01R 19/00* (2006.01)

(52) U.S. Cl.
CPC ....... *G01R 15/205* (2013.01); *G01R 19/0092* (2013.01)

(58) Field of Classification Search
CPC .......................... G01R 15/205; G01R 15/207; G01R 19/0092; Y02E 10/50
See application file for complete search history.

(56) References Cited

U.S. PATENT DOCUMENTS

| 3,199,026 A | 8/1965 | Leibowitz |
| 4,914,383 A | 4/1990 | Wilkerson |
| 6,043,640 A | 3/2000 | Aikins et al. |

(Continued)

FOREIGN PATENT DOCUMENTS

| DE | 69805586 T2 | 10/2002 |
| DE | 102014119276 A1 * | 6/2016 |

(Continued)

OTHER PUBLICATIONS

U.S. Appl. No. 17/267,854, filed Feb. 11, 2021.

(Continued)

*Primary Examiner* — Dominic E Hawkins
(74) *Attorney, Agent, or Firm* — Leydig, Voit & Mayer, Ltd.

(57) ABSTRACT

A current meter for detecting currents in electrical lines includes: a housing having a plurality of receiving grooves formed on a housing wall, into which receiving grooves an electrical line is in each case insertable from outside the housing; and an arrangement of magnetic field sensors enclosed in the housing. The arrangement of magnetic field sensors detects a magnetic field on electrical lines inserted into the receiving grooves. The housing encloses an interior delimited by the housing wall, inside which interior the arrangement of magnetic field sensors is arranged.

12 Claims, 4 Drawing Sheets

(56) References Cited

U.S. PATENT DOCUMENTS

| | | | |
|---|---|---|---|
| 2005/0156587 A1* | 7/2005 | Yakymyshyn | G01R 15/207 324/117 R |
| 2005/0178573 A1 | 8/2005 | James | |
| 2011/0057650 A1 | 3/2011 | Hellwig et al. | |
| 2012/0306486 A1 | 12/2012 | Krummenacher et al. | |
| 2013/0141077 A1 | 6/2013 | Keselman et al. | |
| 2014/0210453 A1* | 7/2014 | El-Essawy | G01R 15/142 324/126 |
| 2015/0042324 A1* | 2/2015 | Fujita | G01R 33/07 324/244 |
| 2015/0212117 A1* | 7/2015 | Hackner | G01R 15/207 324/117 H |
| 2018/0031613 A1 | 2/2018 | Nakayama | |
| 2018/0203044 A1 | 7/2018 | Magoni | |

FOREIGN PATENT DOCUMENTS

| | | |
|---|---|---|
| DE | 102014119276 A1 | 6/2016 |
| DE | 102015115410 A1 | 3/2017 |
| DE | 102016123255 A1 | 6/2018 |
| EP | 2278344 * | 1/2011 ............ G01R 15/20 |
| EP | 3086129 A1 | 10/2016 |
| GB | 2522058 A | 7/2015 |

OTHER PUBLICATIONS

Fluke, "Hand-multimeter, current pliers digital Fluke T6-600/EU Calibrated according to: factory standard", Mar. 16, 2018, model No. T6-600/EU, Conrad Electronic SE, Hirschau, Germany.

* cited by examiner

CURRENT METER FOR DETECTING CURRENTS IN ELECTRICAL LINES

CROSS-REFERENCE TO PRIOR APPLICATIONS

This application is a U.S. National Phase Application under 35 U.S.C. § 371 of International Application No. PCT/EP2019/071241, filed on Aug. 7, 2019, and claims benefit to German Patent Application No. 10 2018 120 008.0, filed on Aug. 16, 2018. The International Application was published in German on Feb. 20, 2020 as WO 2020/035371 under PCT Article 21(2).

FIELD

The disclosure relates to a current meter for detecting currents in electrical lines.

BACKGROUND

A current meter of this type comprises a housing and an arrangement of magnetic field sensors enclosed in the housing.

A current meter of this type can in particular be used for monitoring so called string currents on solar installations. Solar panels are usually connected to one another in series via lines, for example, so that currents—the so called string currents—flow between the solar panels. It is desirable to detect the currents on lines of this type for the purpose of string current monitoring.

For monitoring string currents, current meters are known which usually require electrical lines on which the currents are to be detected to be disconnected. This is cumbersome and additionally represents a significant intervention in the system.

In the case of a current meter known from DE 10 2014 119 276 A1, electrical lines can be placed between housing halves, in order to detect a magnetic field on the electrical lines by means of magnetic field sensors and to infer a current flow in the electrical lines therefrom. In order to attach the current meter to the electrical lines which are to be monitored, it is necessary to disconnect the housing halves from one another. In the attached position, the electrical lines extend through the housing of the current meter, which may make it difficult to seal the housing in a moisture-proof manner to the outside for outdoor use.

SUMMARY

In an embodiment, the present invention provides a current meter for detecting currents in electrical lines, comprising: a housing having a plurality of receiving grooves formed on a housing wall, into which receiving grooves an electrical line is in each case insertable from outside the housing; and an arrangement of magnetic field sensors enclosed in the housing, the arrangement of magnetic field sensors being configured to detect a magnetic field on electrical lines inserted into the receiving grooves, wherein the housing encloses an interior delimited by the housing wall, inside which interior the arrangement of magnetic field sensors is arranged.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

In an embodiment, the present invention provides a current meter available which enables the detection of currents on a plurality of conductors in a simple manner, can be used outdoors and can optionally be retrofitted on existing installations, in particular solar installations.

Accordingly, the housing has a plurality of receiving grooves formed on a housing wall, into which receiving grooves an electrical line can in each case be inserted from the outside. The housing encloses an interior delimited by the housing wall, inside which interior the arrangement of magnetic field sensors for detecting a magnetic field on electrical lines inserted into the receiving grooves is arranged.

Receiving grooves are therefore formed on a housing wall of the housing of the current meter, into which receiving grooves a plurality of electrical lines can be inserted. The receiving grooves are open to the outside so that the electrical lines can be inserted into the receiving grooves from the outside, without the housing having to be opened in this case. This makes attaching the lines to the current meter simple and convenient and in particular also makes it possible to retrofit a current meter on an existing installation in a simple manner, without having to carry out complex modifications to the installation, in particular disconnecting lines.

The arrangement of magnetic field sensors is enclosed inside the interior of the housing. In particular, provision can be made in this case that the receiving grooves are formed on a first side of the housing wall and the electrical lines can be inserted into the receiving grooves on the first side, while the arrangement of magnetic field sensors is arranged on a second side of the housing wall facing away from the first side. The housing wall therefore separates the exterior of the housing from the interior of the housing. The first side corresponds to the outside of the housing wall, while the second side faces the interior. The magnetic field sensors are therefore enclosed inside the housing, are separated from electrical lines inserted into the receiving grooves via the housing wall and can be encapsulated on the outside in such a way that moisture and dirt cannot enter into the housing and into the region of the magnetic field sensors.

In one configuration, the receiving grooves are extended parallel to one another on the housing. A plurality of electrical lines can thus be attached to the housing and received on the receiving grooves parallel to one another. In this case, the receiving grooves are formed as recesses on the housing wall of the housing and are adapted in their inside diameter to the electrical lines which are to be attached to the housing.

In one configuration, the housing is sealed in a moisture-proof manner to the outside. In particular, the housing can meet a desired degree of protection, for example IP67 (according to EN 60529) or the like, and can therefore be weatherproof in such a way that the current meter can be used outdoors.

In one configuration, at least one magnetic field sensor is associated with each receiving groove. For example, two or more magnetic field sensors can be arranged in the region of each receiving groove, which magnetic field sensors are used to detect a magnetic field which is generated in the region of the receiving groove by an electrical conductor inserted into the receiving groove, in order to output a sensor signal, by means of which a current flow in the electrical conductor can be inferred. Magnetic field sensors of this type are thus used for indirect current measurement, by inferring a measured value for the current strength in the electrical conductor—optionally using a suitable calibration—by means of a magnetic field.

For example, two magnetic field sensors can be arranged opposite one another on either side of an associated receiving groove. The magnetic field sensors receive the receiving groove between them, so that an electrical line inserted into the receiving groove comes to rest between the magnetic field sensors. The magnetic field sensors are therefore arranged near to the electrical line inserted into the receiving groove, in order to detect a magnetic field generated by a current flow through the electrical line and to generate a sensor signal which is dependent on the magnetic field.

In one configuration, at least some or all of the magnetic field sensors are formed by magnetoresistive sensors. Magnetoresistive sensors of this type make use of the so called magnetoresistive effect, as a result of which the electrical resistance of a material changes depending on an external magnetic field. A resistance change of this type can be detected and evaluated, in order to infer the strength of the magnetic field and from this the strength of the current flow in the electrical conductor by means of the resistance change.

By means of magnetoresistive sensors of this type, time-varying alternating magnetic fields in an electrical alternating current can be detected in the same manner as time-invariant magnetic fields in a direct current in the electrical line, so that both an alternating current detection and a direct current detection is possible on the electrical lines inserted into the receiving grooves.

In one configuration, the current meter has an electronic assembly, enclosed in the housing, with a control device for evaluating sensor signals obtained via the arrangement of magnetic field sensors. The electronic assembly can have a printed circuit board, for example, on which both the magnetic field sensors and an electronic chip for implementing the control device are arranged. The magnetic field sensors are connected to the control device and feed their sensor signals to the control device which evaluates the sensor signals, in order to infer a current flow in the electrical lines attached to the current meter by means of the sensor signals.

In one configuration, the current meter has a calibration assembly which has a test conductor that can be charged with a test current, which test conductor is arranged relative to the arrangement of magnetic field sensors in the housing in such a way that an evaluation of a detected magnetic field can be calibrated by means of a test current. For example, controlled by the control device, a test current can be generated by a controllable current source, for example, so that a defined current is conducted through the test conductor. In this case, the test conductor is arranged in a defined positional relationship relative to at least one magnetic field sensor of the arrangement of magnetic field sensors, so that a magnetic field is detected at one or at a plurality of magnetic field sensors as a result of the test current. As a result of the known test current and the known positional relationship of the test conductor relative to the magnetic field sensors, a calibration can be carried out via the magnetic fields detected in this way, in order to determine the current flowing in an electrical line from the sensor signals detected via the magnetic field sensors.

In this case, a test conductor can be associated with each magnetic field sensor of the arrangement of magnetic field sensors, so that the magnetic field sensors can be individually calibrated and tested for their functionality. However, it is also conceivable for a test conductor to be associated with only one magnetic field sensor, in order to calibrate the current meter as a whole by means of the one test conductor.

The test conductor can be designed as a separate, for example electrically insulated conductor, for example, which is arranged in a defined positional relationship relative to an associated magnetic field sensor. However, it is also conceivable and possible to form a test conductor by way of a conductor track on a printed circuit board, for example.

In one configuration, the current meter has a first connection for connecting a line for providing an electrical supply and/or for transmitting data signals. The current meter can be electrically supplied via this first connection, for example, in order to electrically supply the electronic assembly enclosed in the housing. In this case, data signals—for example measured values which specify currents flowing through the electrical lines—or analogue standard signals in a range, for example, of 0/4 to 20 mA or −20 mA to 20 mA or voltage signals in a range, for example, of 0 to 10 V, 0 to 5 V, −10 V to +10 V etc. can also be transmitted to a superordinate assembly via the first connection.

If the first connection is designed as a data connection, the first connection can be configured as a USB interface, as an RS485 connection, as an Ethernet connection or as another serial interface, for example. In an advantageous configuration, it is conceivable and possible that both an electrical supply and a data transmission can take place via the first connection.

In addition, the current meter can comprise a second connection for connecting the current meter to a further current meter for detecting currents on further electrical lines. A current meter can thus have two connections, for example, which enables a cascaded connection of current meters to one another, so that a large (essentially arbitrary) number of electrical lines can be monitored via a cascaded arrangement of current meters.

Each current meter can have four or eight receiving grooves for inserting four or eight electrical lines, for example. However, a different number of receiving grooves is also conceivable on each current meter.

Figure 1:
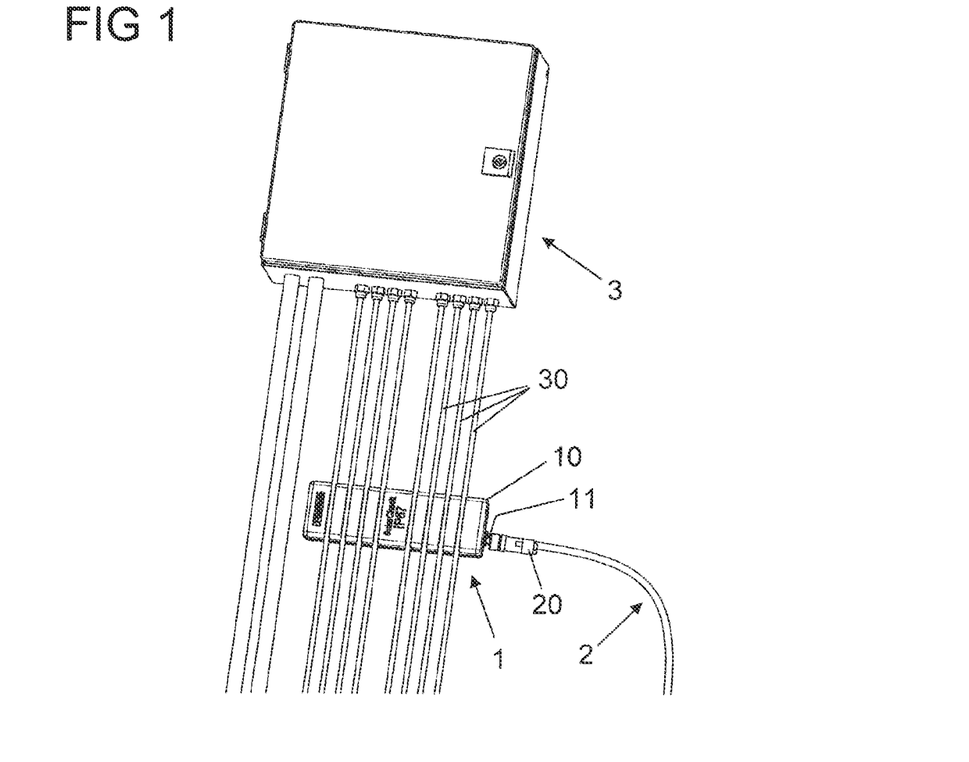
FIG. 1 shows a view of an electrical installation together with a current meter.

FIG. 1 shows a view of a current meter 1 which is used for monitoring currents on electrical lines 30 of an electrical installation 3, for example a solar installation.

Within the context of a solar installation, a plurality of solar modules for generating an electrical current from solar energy are connected to one another in series via electrical lines 30, for example. In this case, the currents flowing between the solar modules are to be monitored (qualitatively and quantitatively), for which purpose current meters 1 are used.

Figure 2:
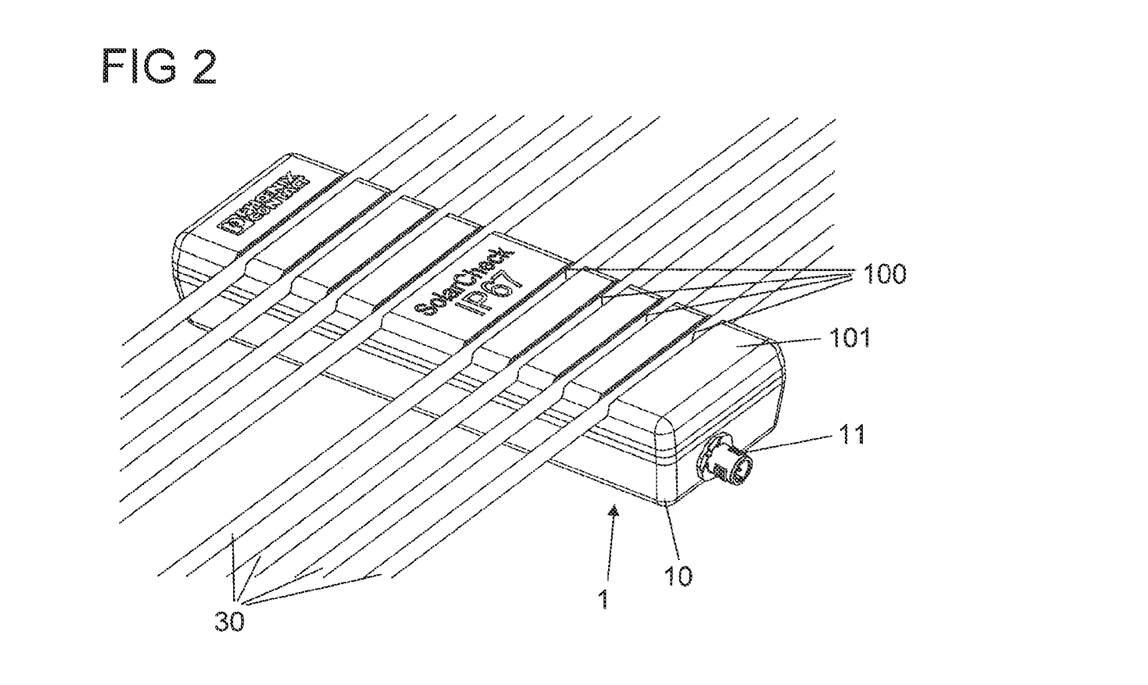
FIG. 2 shows a separate view of the current meter.

An exemplary embodiment of a current meter 1 of this type is represented in FIG. 2. The current meter 1 has a housing 10 which, on a housing wall 101, has a plurality of receiving grooves 100 which are extended parallel to one another for receiving electrical lines 30. (Precisely) one electrical line 100 can be inserted into each receiving groove 100 in such a way that the electrical line 30 is received in the inserted position in the associated receiving groove 100 and is held in the receiving groove 100 in a clamped manner, for example.

The receiving grooves 100 are molded into the outside of the housing wall 101 is such a way that the electrical lines 30 can be inserted into the receiving grooves 100 from the outside. It is therefore not necessary to open the housing 10 of the current meter 1 in order to attach the electrical lines 30 to the current meter 1. In addition, the electrical lines 30 do not have to be disconnected in any way nor does the electrical installation have to be modified in any other way, which makes it possible to retrofit the electrical installation with one or a plurality of current meters 1 in a simple manner.

Figure 3:
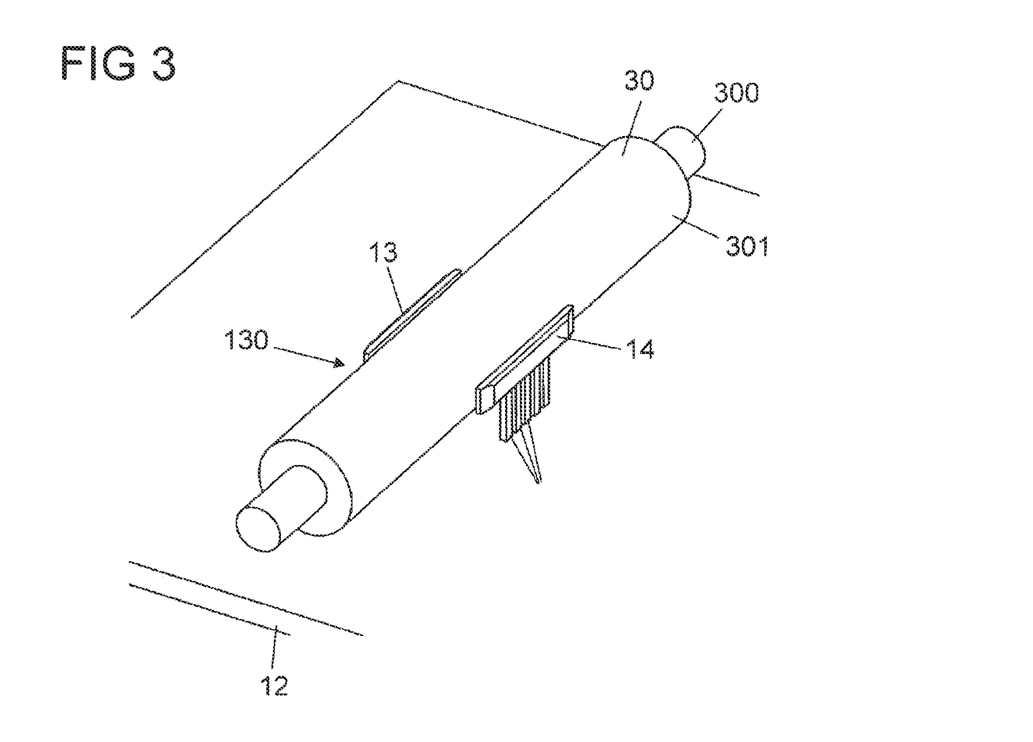
FIG. 3 shows an arrangement of magnetic field sensors of the current meter.

As can be seen in FIG. 3, in the exemplary embodiment represented, two magnetic field sensors 13, 14 are associated with each receiving groove 100 in the form of magnetoresistive sensors for detecting a magnetic field in the region of the receiving groove 100. The magnetic field sensors 13, 14 associated with the respective receiving groove 100 are opposite one another and receive the electrical line 30 between them in the case of an electrical line 30 attached to the receiving groove 100, wherein the magnetic field sensors 13, 14 are enclosed inside the housing 10 and are separated from the electrical line 30 attached to the outside of the housing 10 via the housing wall 101, as represented schematically in FIG. 6.

The magnetic field sensors 13, 14 in the form of the magnetoresistive sensors have an electrical resistance which is variable depending on the magnetic field generated by the electrical line 30. The magnetic field sensors 13, 14 are connected to an electronic assembly 12, in particular a printed circuit board, via connecting lines 130, 140 in such a way that sensor signals, which depend on the magnetic field which exists on an electrical line 30, can be obtained and evaluated via the magnetic field sensors 13, 14, in order to draw conclusions regarding a current flowing through the electrical line 30 by means of the sensor signals.

The electrical line 30 has a line wire 300 surrounded by an electrically insulating sheath 301, through which line wire a current flows during operation of the superordinate electrical installation 3. A magnetic field arises on the electrical line 30 as a result of the current flow, which magnetic field surrounds the electrical line 30 in a circular manner and also penetrates the magnetic field sensors 13, 14 and has an influence on the electrical resistance on the magnetic field sensors 13, 14 as a result of the magnetoresistive effect. The field strength of the magnetic field around the electrical line 30 can therefore be inferred by means of a voltage drop at the magnetic field sensors 13, 14, for example, in order to draw conclusions regarding the current flow through the electrical line 30 therefrom.

Figure 5:
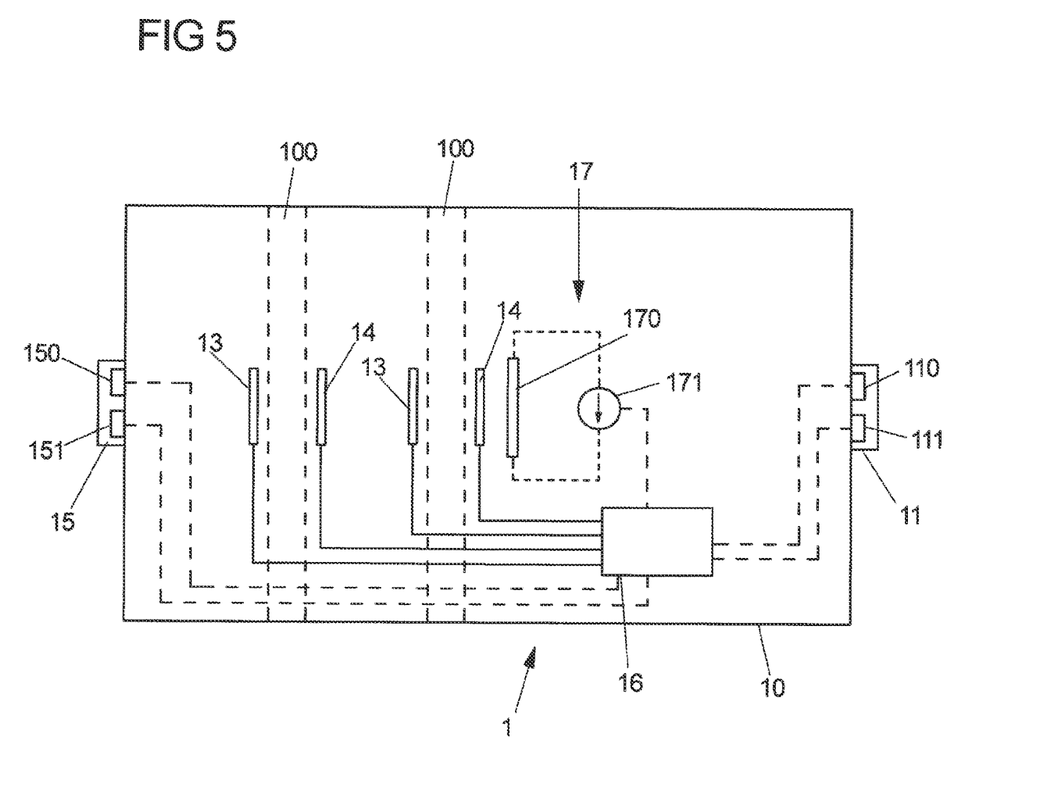
FIG. 5 shows a schematic view of a block diagram of a current meter.

As can be seen in the block diagram according to FIG. 5, in one exemplary embodiment, the current meter 1 has a control device 16 for example in the form of a processor arranged on a printed circuit board, with which the magnetic field sensors 13, 14 associated with the different receiving grooves 100 are connected (only two receiving grooves 100 are schematically represented in FIG. 5). The control device 16 is used to evaluate sensor signals obtained via the magnetic field sensors 13, 14, in order to draw conclusions regarding a current on an electrical line 30 received in a receiving groove 100.

A determination of the current strength in an electrical line 30 by means of obtained sensor signals can take place on the basis of a calibration, for example. For the purpose of the calibration, the current meter 1, as in the exemplary embodiment according to FIG. 5, can have a calibration assembly 17, for example, which makes it possible to carry out a self-calibration of the current meter 1. A self-calibration of this type can be carried out before start-up as well as during running operation, in order to calibrate the current meter 1 before start-up and during operation.

The calibration assembly 17 has a test conductor 170 which is arranged in a defined positional relationship relative to an associated magnetic field sensor 14, so that a calibration can be performed by means of a current flow through the test conductor 170, which calibration allows a conclusion to be drawn regarding the current strength in an electrical line 30 on a receiving groove 100.

The test conductor 170 is connected to a current source 171 which is controllable via the control device 16, by means of which current source a defined current can be conducted through the test conductor 170. By means of the defined current and the sensor signals received via the associated magnetic field sensor 13, 14, a calibration can be carried out, taking into account the positional relationship of the test conductor 170 relative to the associated magnetic field sensor 13, 14, which relates current values to detected magnetic-field-dependent sensor signals, so that a calibration table can be created, for example, on the basis of which the current strength of a current flowing in an electrical line 30 can be determined during actual operation by means of the sensor signals detected via the magnetic field sensors 13, 14.

Figure 7:
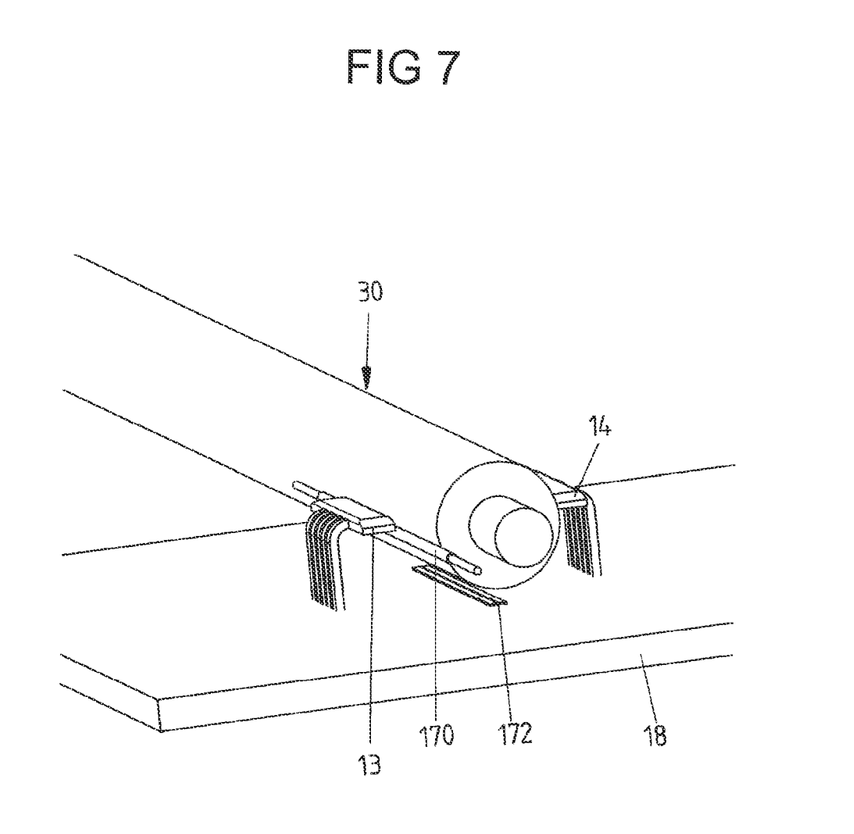
FIG. 7 shows a view of an arrangement of a test conductor of a calibration assembly relative to a magnetic field sensor.

As can be seen in FIG. 7, the test conductor 170 can be designed as an insulated electrical line, with a line wire enclosed in a cable sheath, which extends along the longitudinal direction, along which a line 30 is to be placed into a receiving groove 100, and which is arranged in a defined positional relationship relative to an associated magnetic field sensor 13, 14.

Additionally or alternatively, a test conductor 172 can also be formed by a conductor track on a printed circuit board 18 on which other electrical and electronic components of the current meter 1 are also arranged (in particular the magnetic field sensors 13, 14 and the control device 16).

The test conductor 170, 172 is in each case connected to a current source 171 for introducing a test current.

Figure 6:
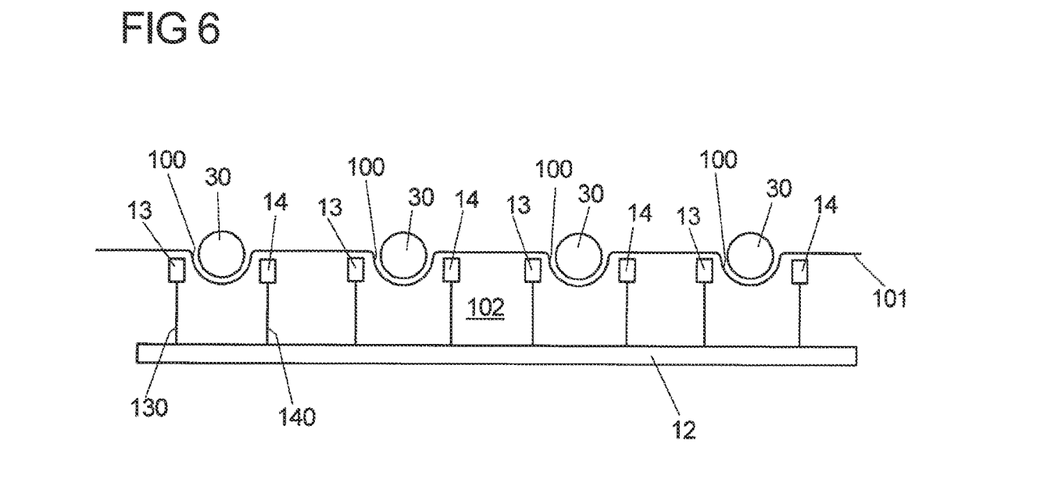
FIG. 6 shows a schematic view of electrical lines on receiving grooves of a housing of a current meter.

As can be seen in FIG. 6, the magnetic field sensors 13, 14 associated with the receiving grooves 100 are arranged inside an interior 102 enclosed by the housing 10. In contrast, the electrical lines 30 can be inserted into the receiving grooves 100 formed on the housing wall 101 from the outside in such a way that the electrical lines 30 come to rest in the inserted position in the receiving grooves 100 but outside of the housing 10 and the magnetic field sensors 13, 14 are separated from the electrical lines 30 via the housing wall 101. The magnetic field sensors 13, 14 are connected to the printed circuit board of the electronic assembly 12 via connecting lines 130, 140 and are connected to the control device 16 (see FIG. 5).

As can be seen in FIG. 2, the current meter 1 has a first connection 11, via which a line 2 can be connected to the current meter 1, in order to provide an electrical supply to the current meter 1 and/or to transmit data to the current meter 1 or from the current meter 1 to a superordinate assembly.

If the connection 11 is designed for data transmission, the connection 11 can be implemented by a USB interface, an RS485 interface or an Ethernet interface, for example.

In one advantageous configuration, the connection 11 is designed for providing an electrical supply to the current meter 1 and additionally for a data transmission. For this purpose, as represented schematically in FIG. 5, the connection 11 can have different contact assemblies 110, 11 via which, on the one hand, a feed current (contact assembly 110) and, on the other hand, data (contact assembly 111) can be transmitted, so that both the electrical supply and a data transmission for example for sending measured values from the current meter 1 to a superordinate assembly takes place via the connection 11.

Figure 4:
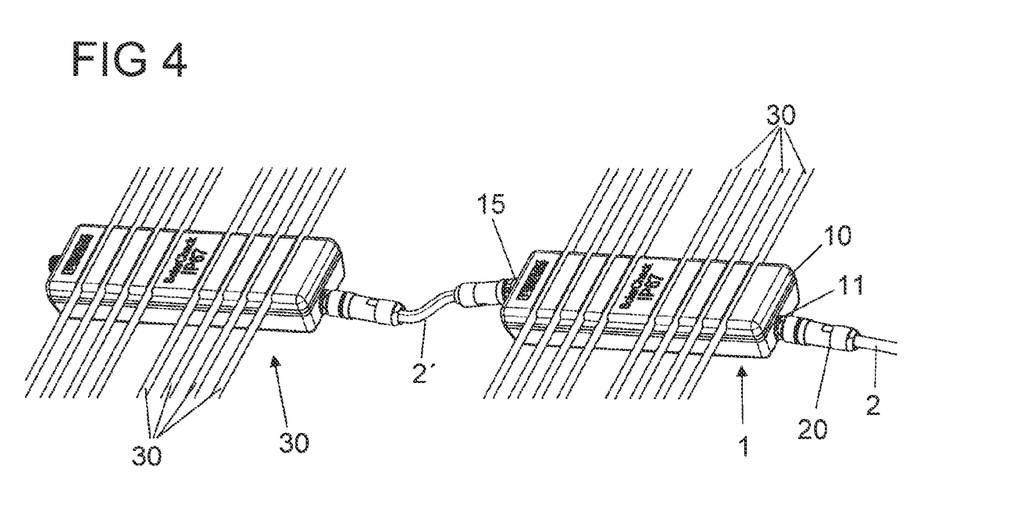
FIG. 4 shows a view of a cascaded connection of a plurality of current meters.

In one exemplary embodiment, the current meter 1 additionally has a second connection 15, as represented in FIG. 4 and FIG. 5, by means of which further current meters 1' can be connected to the current meter 1, in order to create a cascaded arrangement of current meters 1, 1'. Via the connection 15, the current meter 1 can be connected to the further current meter 1' via a line 2', wherein, on the one hand, an electrical supply and, on the other hand, a data transmission, in turn, takes place via contact assemblies 150, 151 of the connection 15.

A current meter arrangement for measuring the current strength on basically any number of electrical lines 30 can be created by a cascaded connection of a plurality of current meters 1, 1'. In this case, each current meter 1, 1' can be designed to receive eight lines 30, for example, so that currents can be measured on a multiple of eight lines 30 by connecting a plurality of current meters 1, 1'.

In another configuration, there may be four electrical lines 30 to be attached to each current meter 1, for example, and correspondingly each current meter 1 may have four receiving grooves 100, for example. However, a different number of receiving grooves 100 is also conceivable and possible on a current meter 1.

The housing 10, inside which the electronic assembly 12 is enclosed with the magnetic field sensors 13, 14 and the control device 16, is preferably encapsulated in a moisture-proof manner and can correspond to a desired degree of protection, for example IP67. This makes it possible for the current meter 1 to be used outdoors.

A current meter 1 of the type described may be attached to an electrical installation 3. The housing 10 of the current meter 1 may be screwed together with the electrical installation or be fixed to the electrical installation in any other way for this purpose. It is also conceivable and possible to configure the current meter 1 in such a way that it can be arranged on a mounting rail and can be combined with other electrical or electronic devices.

The underlying concept of the solution is not limited to the exemplary embodiments described previously, but rather may also be implemented in a completely different way.

In particular, a current meter of the type described is not only suitable for monitoring string currents on solar installations, but rather may be used in principle for current measurement on completely different electrical installations.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMBERS

1, 1' current meter
10 housing
100 receiving groove
101 housing wall
102 interior
11 connection
110, 111 contact assembly
12 electronic assembly (printed circuit board)
13, 14 magnetic field sensor
130, 140 connecting lines
15 connection
150, 151 contact assembly
16 control device
17 calibration assembly
170 test conductor
171 current source
172 test conductor
18 printed circuit board
2, 2' line
20 connection
3 electrical assembly (solar module)
30 lines
300 line wire
301 line sheath

The invention claimed is:

1. A current meter for detecting currents in electrical lines, comprising:
   a housing enclosing an interior delimited by a housing wall, the interior in an operative state of the housing being sealed in a moisture-proof manner to an outside, the housing having a plurality of receiving grooves formed on the housing wall, an electrical line being placeable onto each receiving groove of the plurality of receiving grooves from outside the housing while the housing is in the operative state; and
   an arrangement of magnetic field sensors enclosed in the interior of the housing, the arrangement of magnetic field sensors being configured to detect a magnetic field on electrical lines inserted into the receiving grooves, wherein the arrangement of magnetic field sensors is arranged inside the interior.

2. The current meter as claimed in claim 1, wherein the receiving grooves are formed on a first side of the housing wall and the electrical lines are insertable into the receiving grooves on the first side, and wherein the arrangement of magnetic field sensors is arranged on a second side of the housing wall facing away from the first side.

3. The current meter as claimed in claim 1, wherein the receiving grooves are extended parallel to one another on the housing.

4. The current meter as claimed in claim 1, wherein at least one magnetic field sensor of the arrangement of magnetic field sensors is associated with each receiving groove.

5. The current meter as claimed in claim 1, wherein at least two magnetic field sensors of the arrangement of magnetic field sensors are associated with each receiving groove.

6. The current meter as claimed in claim 1, wherein two magnetic field sensors of the arrangement of magnetic field sensors are arranged opposite one another on either side of an associated receiving groove.

7. The current meter as claimed in claim 1, wherein at least some magnetic field sensors of the arrangement of magnetic field sensors comprise magnetoresistive sensors.

8. The current meter as claimed in claim 1, further comprising:

an electronic assembly, enclosed in the housing, with a control device configured to evaluate sensor signals obtained via the arrangement of magnetic field sensors.

9. The current meter as claimed in claim 1, further comprising:

a calibration assembly which has a test conductor chargeable with a test current, which test conductor is arranged relative to the arrangement of magnetic field sensors in the housing such that an evaluation of a detected magnetic field is calibratable by the test current.

10. The current meter as claimed in claim 1, further comprising:

a first connection configured to connect a line for at least one of providing an electrical supply and transmitting data signals.

11. The current meter as claimed in claim 1, further comprising:

a second connection configured to connect the current meter to a further current meter configured to detect currents on further electrical lines.

12. A current meter for detecting currents in electrical lines, comprising:

a housing having a plurality of receiving grooves formed on a housing wall, into which receiving grooves an electrical line is in each case insertable from outside the housing;

an arrangement of magnetic field sensors enclosed in the housing, the arrangement of magnetic field sensors being configured to detect a magnetic field on electrical lines inserted into the receiving grooves; and a calibration assembly which has a test conductor chargeable with a test current, which test conductor is arranged relative to the arrangement of magnetic field sensors in the housing such that an evaluation of a detected magnetic field is calibratable by the test current, wherein the housing encloses an interior delimited by the housing wall, inside which interior the arrangement of magnetic field sensors is arranged.

* * * * *